United States Patent [19]

Edlin et al.

[11] Patent Number: 4,634,969
[45] Date of Patent: Jan. 6, 1987

[54] TIME VARYING MAGNETIC FIELD SAFETY PROBE

[75] Inventors: George R. Edlin; Robert A. Snead, both of Huntsville, Ala.

[73] Assignee: The United States of America as represented by the Secretary of the Army, Washington, D.C.

[21] Appl. No.: 610,219

[22] Filed: May 14, 1984

[51] Int. Cl.$^4$ .................. G01R 29/08; G01R 33/02
[52] U.S. Cl. ........................ 324/95; 324/258; 340/600; 343/703
[58] Field of Search ............... 324/95, 133, 96, 122, 324/258, 234, 239; 340/600; 343/703; 455/67

[56] References Cited

U.S. PATENT DOCUMENTS

| | | | |
|---|---|---|---|
| 3,130,368 | 1/1962 | Hoover | 343/703 |
| 3,182,262 | 5/1965 | Schumann | 324/95 |
| 3,464,010 | 8/1969 | Saul | 343/703 |
| 3,783,448 | 1/1974 | Brodwin | 343/703 X |
| 3,927,375 | 12/1975 | Lanoe et al. | 340/600 X |
| 4,032,910 | 6/1977 | Hollway et al. | 340/600 |
| 4,338,595 | 7/1982 | Newman | 340/600 |
| 4,431,965 | 2/1984 | Aslan | 343/703 X |

FOREIGN PATENT DOCUMENTS 2739052  3/1978  Fed. Rep. of Germany ...... 324/133
2031167  4/1980  United Kingdom ............... 324/95

OTHER PUBLICATIONS

Millivac Instruments, "Sensitive Precision RMS Millivoltmeter", MV-32A RMS Voltmeter Specification.
Greene, F., "NBS Field-Strength Standards and Measurements (30 Hz to 1000 MHz)", Proc. IEEE, vol. 55, No. 6, Jun. 1967, pp. 970–981.

*Primary Examiner*—Reinhard J. Eisenzopf
*Assistant Examiner*—Stephen M. Baker
*Attorney, Agent, or Firm*—Anthony T. Lane; Robert P. Gibson; Freddie M. Bush

[57] ABSTRACT

A passive safety probe for placement in a time varying magnetic field to alert personnel when the power density of high intensity electromagnetic fields reach and exceed applicable personnel safety limits. The probe senses the magnetic field present with a loop antenna. The loop antenna produces a voltage output in response to the magnetic field. The output voltage is linearized by a frequency dependent filter and rectified to provide a direct current output which is subsequently coupled to an attention getting indicating means such as a light emitting diode and/or a horn. When detected field voltage exceeds the threshold of the indicating means, a visual or audible response occurs, indicating that safe field levels have been exceeded.

3 Claims, 1 Drawing Figure

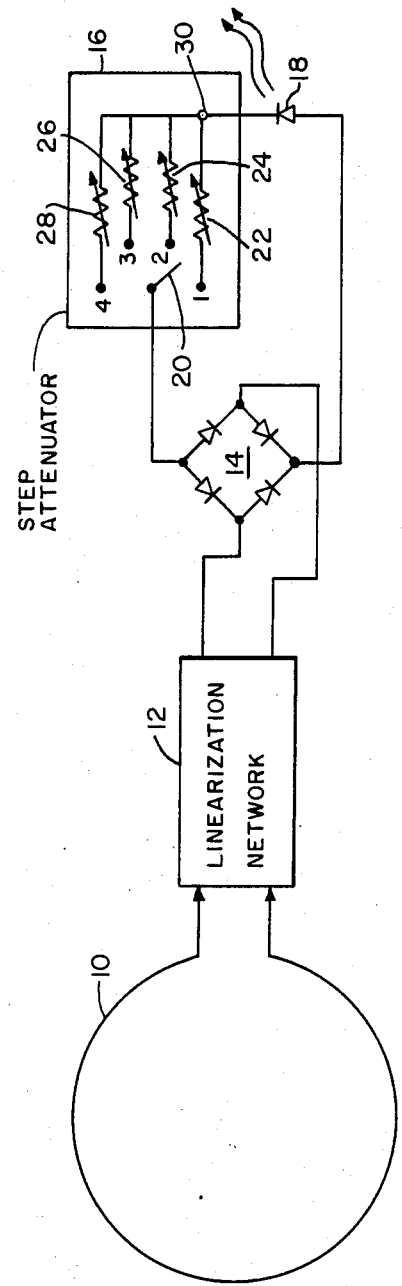

TIME VARYING MAGNETIC FIELD SAFETY PROBE

DEDICATORY CLAUSE

The invention described herein may be manufactured, used, and licensed by or for the Government for governmental purposes without the payment to us of any royalties thereon.

BACKGROUND OF THE INVENTION

Existing probe monitors that measure power density require batteries or power supplies, are expensive, and are easily damaged by inadvertent exposure to the extremely high fields that are present in close proximity to high gain/high power transmitting antennas. Personnel safety in the presence of high intensity electromagnetic fields is jeopardized by the propensity of such monitors to be easily damaged. A simple to use and inexpensive monitor that is highly reliable in the presence of high intensity fields is needed to provide accurate warning when safe field levels are exceeded. The time varying magnetic field safety probe quickly and accurately determines the safety of a work area against this hazard.

SUMMARY OF THE INVENTION

A time varying magnetic field monitor for placement in high intensity electromagnetic fields to alert personnel when excessive power density safety limits are exceeded. The monitor or probe is passive and senses the magnetic field with a loop antenna. An output voltage, induced in the antenna, is filtered and rectified to provide a direct current output indicative of the electromagnetic field density. The output current activates indicating circuitry which serves as attention getting means when the acceptable threshold level of exposure is exceeded.

BRIEF DESCRIPTION OF THE DRAWING

The single FIGURE is a partial schematic-partial block diagram of a preferred embodiment of the passive safety probe.

DESCRIPTION OF THE PREFERRED EMBODIMENT

The single FIGURE discloses a preferred embodiment of the passive safety probe or monitor. A simple loop antenna 10 is coupled to provide an input to a linearization network 12 and a full wave bridge rectifier 14 is coupled to receive an output from linearization network 12. A step attenuator 16 is connected in series with an indicating circuit 18 and coupled together across the output of full wave bridge rectifier 14.

Linearization network 12 is a frequency dependent filter which, for example, may have a 6 decibel per octave rolloff. The filter corrects for the characteristic increase in loop output voltage with an increase in frequency. Step attenuator 16 is used by an operator to select one of several power density levels for activating the indicating circuit 18. Attenuator 16 may, typically, be comprised of a step or selector switch 20 having positions 1-4 connected respectively through resistors or potentiometers 22, 24, 26 and 28 to a common junction 30. Indicating circuit 18 is a light emitting diode (LED) for providing a visible indication when the current level passing therethrough indicates the excessive signal strength present on antenna 10. Alternatively, indicating means 18 may produce audible and/or recorded indication of signal strength if desired.

In operation, the loop antenna is placed in a work area or region of interest to determine quickly and accurately whether or not the area is safe for human occupancy. The entire monitor assembly may be exposed in the area, or only the antenna may be exposed, with the remaining circuitry being shielded or remotely located, as desired or required by particular environmental circumstances. With the loop 10 in the area of interest, any oscillating magnetic field of interest that is present will excite the loop and produce a voltage output defined by the equation $V = A(dB/dt)$, where A is the antenna loop area in square meters and $dB/dt$ is the time rate of change of the magnetic field. The voltage generated is linearized by filter 12, rectified by the diode bridge rectifier 14 and coupled across attenuator 16 and LED 18. When the detected field voltage V reaches or exceeds the turn-on threshold of the LED, it produces a visual indication of field levels in excess of the safe level. All power for the probe is derived from the electromagnetic field being monitored.

The probe or monitor allows persons working around high power emitters to readily determine whether or not an area is safe. Prior to operation of the probe, calibration in a known field at all frequencies of interest is in order. The antenna is basically broad band but several antenna sizes may be used to precisely and accurately cover a range of frequencies. Therefore antenna 10 is shown to be removably coupled, as by coupling means 11, to network 12. Obviously a particular antenna may be selected switchably or by plug-in replacement to coincide with different frequency ranges and with calibrated switch positions of attenuator 16. For example, switch 20 positions 1 and 2 may be for use with antenna 10 and positions 3 and 4 may be calibrated for use with another antenna. Typically, the potentiometer 22 may be calibrated to turn LED 18 on when 10 milliwatts or more per square centimeters (10 mW/cm$^2$) is incident on loop 10. Potentiometer 24 may be calibrated to turn on the LED at 5 mW/cm$^2$. The probe is usable at frequencies ranging from a few megahertz to 18 gigahertz depending on the loop area and selection of the detection diodes 14. The limiting factor on the low frequency end of the spectrum is maximum diameter of the loop 10 required. This is determined by the decrease in output voltage with decreasing frequency with constant loop area. The limiting factor on the high end of the spectrum is the characteristics of the diodes used to provide rectification.

The loop antenna 10 may be circular, as shown, square, or irregular shaped as long as the area within the loop may be readily determined. The detection diodes 14 must be selected for various frequeny bands since the capacitance of diodes that is aceptable at one band or range may cause a short circuit at a higher frequency of operation of the radiation source. A typical diode for use at 1 gigahertz is a IN832; for ranges up to 18 GHz Schottky diodes are appropriate. The circular loop diameter of antenna 10 may vary, typically, from 6-8 inches for a few megahertz input frequency to a 1-inch diameter loop for a 10-15 gigahertz signal. The high frequency limits for a loop (circle) antenna is given by the equation $f_{max} = 0.35c/2\pi r$, where c is the speed of light and r is the radius of the circle. Thus, for a circular antenna having an upper limit or maximum frequency of 1 GHz, the radius r of the loop may be calculated to be 16.7 centimeters.

For calibration purposes, at each frequency or frequency range of interest, the probe is calibrated initially with a standard, established system of measurement simultaneously placed in the field of interest. Typical of such a system is the Crawford cell designed by the National Bureau of Standards. The Crawford cell utilizes an expanded transmission line. With a known power flowing through the line the system indicates the power and the probe is calibrated to agree with the Crawford cell, the LED or other indicator being adjusted via the attenuator 16 to indicate a change at the desired level.

Although the present invention has been described with reference to a preferred embodiment, workers skilled in the art will recognize that changes may be made in form and detail without departing from the spirit and scope of the foregoing disclosure. Accordingly, the scope of the invention should be limited only by the claims appended hereto.

We claim:

1. A passive magnetic field safety probe for use in a time varying electromagnetic field and comprising: passive sensing means, a full wave diode bridge rectification means for providing a direct current output, linearization means coupled between said passive sensing means and said rectification means, and a resistance attenuating means and indicating means connected in series with said direct current output for indicating the presence or absence of predetermined minimum levels of electromagnetic radiation present on said passive sensing means, said passive sensing means being a loop antenna having a single, unbroken loop between first and second terminals, and said linearization means being a frequency dependent filter coupled to said antenna terminals.

2. A passive magnetic field safety probe for use in a time varying electromagnetic field and comprising: a loop antenna having a single, unbroken loop between first and second terminals; a full wave bridge rectification means for providing a direct current output; linearization means coupled between said loop antenna and said rectification means; and attenuating means and indicating means connected in series with said direct current output for indicating the presence or absence of predetermined minimum levels of electromagnetic radiation present on said loop antenna; said attenuating means being a plurality of resistances, each resistance having one end thereof connected to a common junction and connected to said indicating means, a selector switch having a common, selector terminal thereof coupled to said rectification means, and said resistances having respective other ends thereof coupled to said selector switch for selectable coupling of individual resistances through the switch to the rectification means; and said linearization means being a frequency dependent filter coupled to said antenna terminal.

3. A passive magnetic field safety probe for use in a variable electromagnetic field and comprising: a loop antenna responsive to time varying magnetic fields to produce a voltage output which is a function of the product of area encompassed by the antenna loop and the time rate of change of the magnetic field, a frequency dependent filter connected to said antenna and providing a variable output voltage in response to input voltage signals, indicating means coupled to said filter and responsive to said output for indicating electromagnetic radiation present at said antenna, voltage rectification means coupled between the output of said filter and said indicating means for producing a direct current output to said indicating means in response to said filter output voltage, and a step attenuator circuit coupled between the output of said rectification means and said indicating means for selectably controlling the level of direct current coupled to said indicating means.

* * * * *